United States Patent [19]
Harris et al.

[11] Patent Number: 6,128,034
[45] Date of Patent: Oct. 3, 2000

[54] HIGH SPEED LEAD INSPECTION SYSTEM

[75] Inventors: Charles K. Harris, Dallas; Michael C. Zemek, Rowlett, both of Tex.

[73] Assignee: Semiconductor Technologies & Instruments, Inc., Dallas, Tex.

[21] Appl. No.: 08/200,616

[22] Filed: Feb. 18, 1994

[51] Int. Cl.[7] .................................................. H04N 7/18
[52] U.S. Cl. ............................................. 348/87; 348/126
[58] Field of Search ................................. 348/86, 87, 92, 348/94, 95, 125, 126, 131, 127; 340/653; 250/561, 343; H04N 7/18

[56] References Cited

U.S. PATENT DOCUMENTS

| | | | |
|---|---|---|---|
| 4,121,103 | 10/1978 | Calhoun | 250/343 |
| 4,680,627 | 7/1987 | Sase et al. | 348/126 |
| 4,696,047 | 9/1987 | Christian et al. | 348/126 |
| 4,731,649 | 3/1988 | Chang et al. | 348/127 |
| 4,914,513 | 4/1990 | Spigarelli et al. | 348/87 |
| 4,973,343 | 11/1990 | Frazee, Jr. et al. | 348/86 |
| 5,058,177 | 10/1991 | Ephrem | 348/92 |
| 5,096,353 | 3/1992 | Tesh et al. | 348/86 |
| 5,163,232 | 11/1992 | Gonzales, Jr. et al. | 340/653 |
| 5,212,390 | 5/1993 | LeBeau et al. | 250/561 |
| 5,237,622 | 8/1993 | Howell | 348/87 |

*Primary Examiner*—Richard Lee
*Attorney, Agent, or Firm*—Akin, Gump, Strauss, Hauer & Feld, LLP

[57] ABSTRACT

An inspection system determines if leads of a semiconductor device are in proper positions. Images from at least two sides of the semiconductor device are captured along with calibration marks formed in the side of a track upon which the semiconductor device is mounted. All leads and calibration marks are captured in a single video image, the images from one side of the semiconductor device being off set from the image from the other side.

17 Claims, 3 Drawing Sheets

HIGH SPEED LEAD INSPECTION SYSTEM

FIELD OF THE INVENTION

This invention relates to inspection systems for semiconductor devices, and more particularly to an inspection system that utilizes reflective back-lighting for the leads, and an optical system that combines the leads from both dies of a surface mount device in to a single video image.

BACKGROUND OF THE INVENTION

In testing and mounting semiconductor devices it is necessary that the leads of the device be correctly positioned and the ends of leads lie in a common plane. This is particularly true for surface-mount devices. The leads of the semiconductor device may be bent side ways, out, in or down moving the end of the pin from a plane common with the ends of the other pins. In some instances, one or more pins may have a greater height than the others.

Existing planarity inspection equipment is either not cost-effective or performs the inspection "off-line" as in a quality control operation. The hardware required for off-line inspection is inexpensive, however, the inspection is done manually, lead by lead, making 100% inspection time consuming as well as cost prohibitive. Automatic equipment which can be used for on-line inspection is actually stand-alone equipment integrated with the other processing equipment.

In lead inspection systems in which CCD cameras are used, either the device is rotated to present both sides of the device to the same optics and the CCD camera or two separate sets of optics and cameras are used to view both side of the device simultaneously. Either method requires additional image capture and processing time, and usually additional hardware.

The lighting of the leads is critical to capture an accurate image for determining the position of each lead. Therefore, the lighting must be directed toward the leads to provide optimum illumination for the optical system that is imaging the leads.

SUMMARY OF THE INVENTION

The invention relates to an inspection system in which an inspection station has calibration marks formed in the station material handling track. This avoids separate calibration hardware and provide calibration information with every image captured for analysis. Lights are mounted to direct light from below the mounting track. The light impinges on the surface of the track on which the calibration marks are formed. This illuminated surface is on a side of the leads being inspection opposite from the camera. This "back" illumination of the leads provides a distinct and sharp image of the lead outline.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
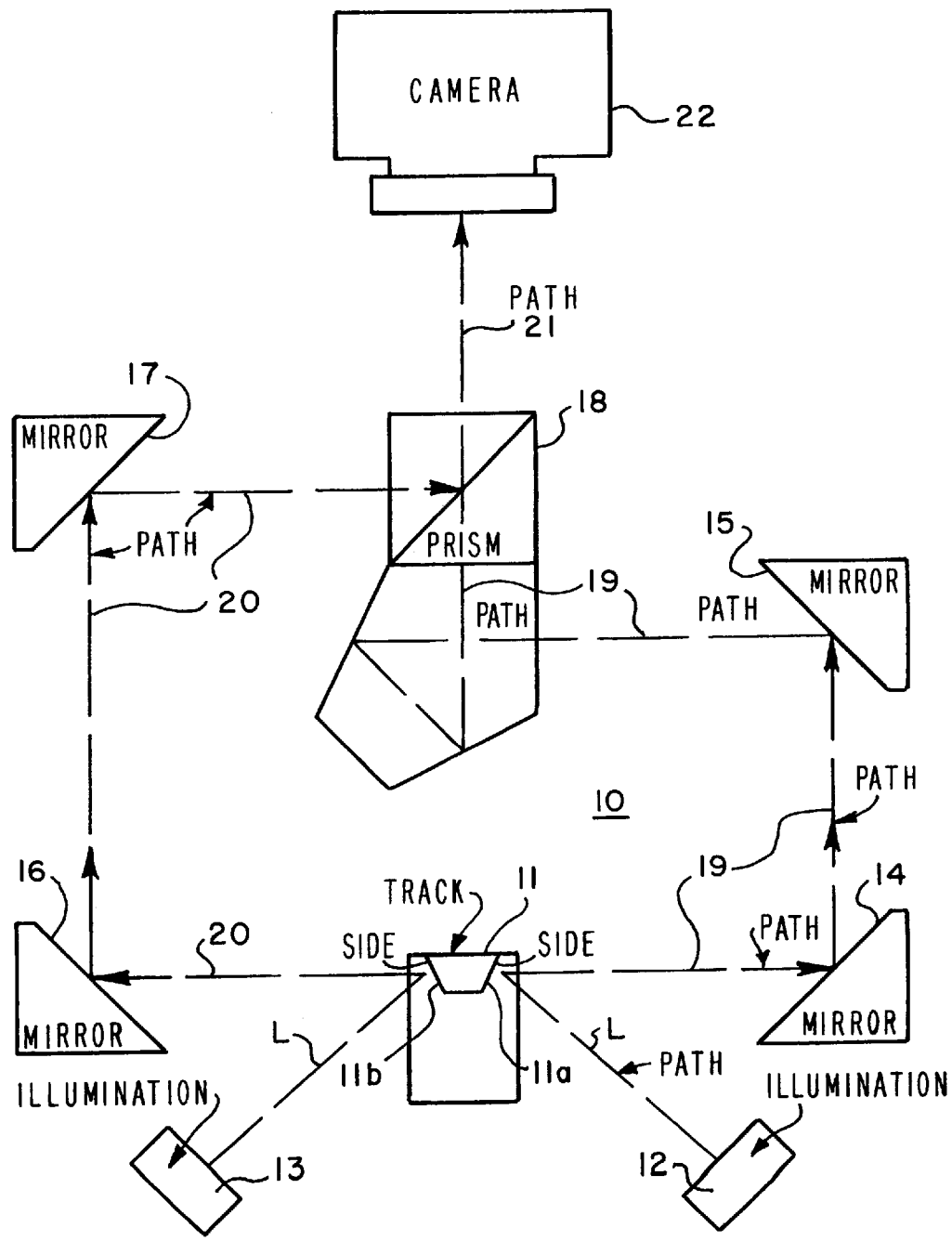
FIG. 1 shows the inspection system of the present invention.

FIG. 1 illustrates the inspection system for inspecting leads on, for example, surface mount semiconductor devices. System 10 includes a device track 11 upon which semiconductor devices are mounted during inspection. Track 11 may be a track extending from a previous processing station. The semiconductor devices may be advanced along track 11, positioning a series of devices, one at a time, to be inspected.

On each side of and below track 11, are two sources of illumination 12 and 13. Each illumination source directs light to one of the sloped sides 11a and 11b along path L. One side 11a of track 11 is a mirror 14 directing an image of side 11a (and the leads of a mounted semiconductor device, FIGS. 5 and 6) along path 19 to another mirror 15. Mirror 15 directs the reflected image to prism 18 which directs the image upward.

Figure 7:
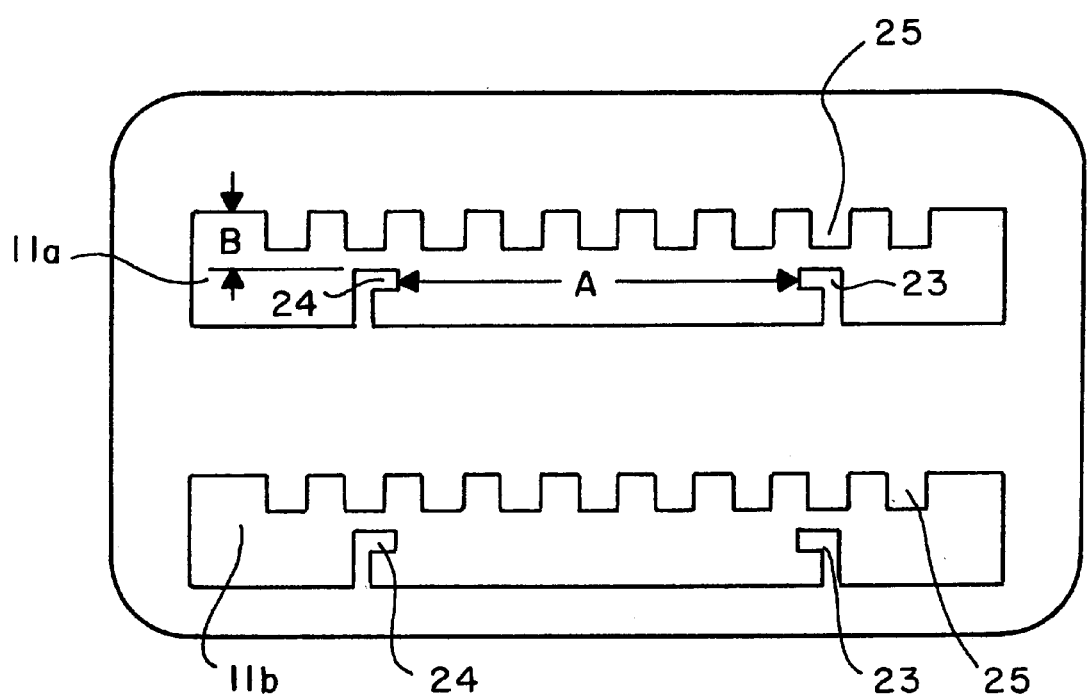
FIG. 7 is a video display of combined images of two sides of the semiconductor device and the calibration marks.

On side 11b of track 11, is mirror 16 which reflects the image on side 11b to mirror 17 along path 20. Mirror 17 reflects the image to prism 18 where the image along path 19 is merged with the image from path 19, and directed to camera 22 along path 21. The two images are not merged one on another, but are offset as illustrated in FIG. 7, discussed below.

Figure 2:
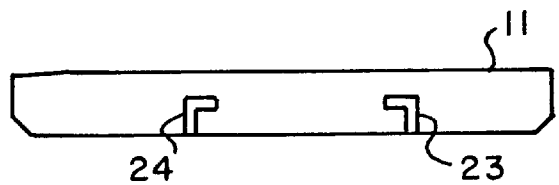
FIG. 2 is a side view of the device handling track.

FIG. 2 is a side view of track 11. Engraved, stamped or etched into the sides of track 11 are reference indicia 23 and 24. Indicia 23 and 24 are calibration marks used in determining if the leads of a device are bent and out of place.

Figure 3:
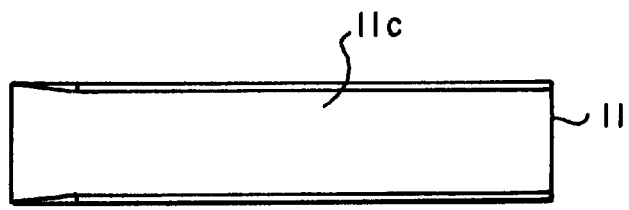
FIG. 3 is a top view of the device handling track.
Figure 4:
FIG. 4 is an end view of the device handling track.

FIG. 3 is a top view of track 11, and FIG. 4 is an end view of track 11. Sides 11a and 11b are sloped inward from top to bottom of track 11. Sides 11a and 11b are polished to a mirror finish to reflect the light from light sources 12 and 13 (FIG. 1). Top 11c of track 11 is recessed to provide a track in which semiconductor devices are placed and moved.

Figure 5:
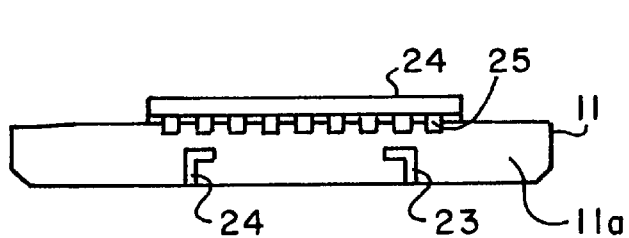
FIG. 5 is a side view of the device handling track with a semiconductor device on the track.

FIG. 5 shows track 11 with a semiconductor device 24 in recess 11c. Leads 25 of device 24 extend over the sides of track 11, and extend downward along sides 11a and 11b, adjacent calibration marks 23 and 24. Each side, 11a and 11b, have calibration marks.

Figure 6:
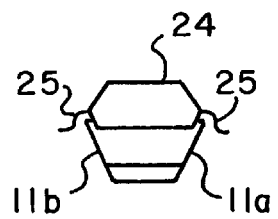
FIG. 6 is an end view of the device handling track with a semiconductor device on the track.

FIG. 6 is an end view of track 11 showing device 24 mounted thereon and leads 25 extend downward along sides 11a and 11b.

FIG. 7 represents a video display of the combine images of the leads 25 of semiconductor device 24 and calibration marks 23, 24, as shown in FIG. 5. Each side of track 11 is illuminated by a light sources, 12-13. The light is directed to the polished sides 11a and 11b providing a back-lighting for leads 25. With back-lighting, the outline of each lead is distinct against the illuminated polished surface of sides 11a and 11b. Since calibration marks 23 and 24 are etched into the surface 11a and 11b, they will reflect light differently from the polished sides 11a and 11b, appearing darker than the area surrounding the calibration marks. The calibration marks and leads will appear dark compared with the polished sides 11a and 11b, Since calibration marks 23 and 24 are of a known size and position, then the image of the leads can be accurately measured to determine if the leads are within specification, or if they are bent, or twisted, and also important for surface mount devices, that the ends of the leads are in a common plane.

The calibration marks are a predetermine distance apart as defined by dimension A, and the top of the calibration marks are a predetermined distance B from the top of the track 11. An image of the leads and calibration marks on each side of track 11 are captured in a single video image, allowing the lead positions on both sides of the device to be process simultaneously. With a know pixel resolution, the dimension and placement of each lead is then determined.

What is claimed:

1. A lead inspection system utilizing image capture to determine defects in lead placement, comprising:
    a track for holding a semiconductor device to be inspected;
    means for viewing a first side of said track and leads of said semiconductor device under inspection to form a first image and a second side of said track and leads of said semiconductor device under said inspection to form a second image;
    an optical system for combining said first image and said second image of said first side and said second side into one video display; and calibration marks on said first side and said second side of said track adjacent the leads of said semiconductor device for providing calibration information with the leads to determine a position of the leads.

2. The system according to claim 1, wherein said track has sloping sides, sloping inward from top to bottom.

3. The system according to claim 1, wherein said calibration marks are formed in track sides of said track.

4. The system according to claim 1, wherein said track has a top side, and said top side has a groove therein along which said semiconductor device is moved for inspection.

5. The inspection system according to claim 1, including illumination sources for said first side and said second side of said track.

6. The system according to claim 1, wherein said leads are back lighted by illumination sources and said first side and said second side of said track.

7. The system according to claim 1, wherein said means for viewing said first side and said second side of said track, includes optical mirrors reflecting images from said first side and said second side of said track into an optical prism which directs the image of each side of said track into a video camera.

8. A lead inspection system utilizing image capture to determine defects in lead placement, comprising:
    a track, having two opposite sides, for holding a semiconductor device to be inspected with leads of said semiconductor device extending downward from said two opposite sides;
    calibration marks on a first side and a second side of said track adjacent the leads of said semiconductor device for providing calibration information with the leads to determine a position of the leads; and
    optical means for combining a first image of said first side and a second image of said second side of the leads of said two opposite sides of said semiconductor device mounted on said track, with said calibration marks to form a common video display.

9. The system according to claim 8, wherein said track has sloping sides, sloping inward from top to bottom.

10. The system according to claim 8, wherein said calibration marks are included in track sides of said track.

11. The system according to claim 8, wherein said track has a top side and said top side has a groove therein along which said semiconductor device is moved for inspection.

12. The inspection system according to claim 8, including illumination sources for two track sides of said track.

13. The system according to claim 8, wherein said leads are back lighted by illumination sources and two track sides of said track.

14. The system according to claim 8, wherein said optical means for combining said first image and said second image, includes optical mirrors reflecting images from said two track sides of said track into an optical prism which directs the image of each side of said track into a video camera.

15. A method for inspecting leads of a semiconductor device in a single video image, comprising the steps of:
    mounting a semiconductor device on a track, having calibration marks formed on two track sides of the track, with the leads extending down the sides of the track adjacent the calibration marks;
    illuminating the track to provide back lighting of the leads being inspected, and contrast between the calibration marks and track sides; and
    capturing the leads and calibration marks with at least two images in a common video image.

16. The method according to claim 15, wherein said step of capturing includes combining at least two images of the leads and calibration marks from at least two sides of the semiconductor device and said track into a common image.

17. The method according to claim 15, wherein said at least two images of the leads of said semiconductor device from two sides of said track are offset one from the other in the common video image.

* * * * *